United States Patent [19]

Beasom et al.

[11] Patent Number: 5,801,084
[45] Date of Patent: Sep. 1, 1998

[54] BONDED WAFER PROCESSING

[75] Inventors: James Douglas Beasom, Melbourne Village; Craig James McLachlan, Melbourne Beach, both of Fla.

[73] Assignee: Harris Corporation, Melbourne, Fla.

[21] Appl. No.: 843,302

[22] Filed: Apr. 14, 1997

Related U.S. Application Data

[63] Continuation of Ser. No. 653,808, May 28, 1996, abandoned, which is a continuation of Ser. No. 335,600, Nov. 8, 1994, abandoned, which is a continuation of Ser. No. 900,202, Jun. 17, 1992, abandoned.

[51] Int. Cl.$^6$ .................................................. H01L 21/46
[52] U.S. Cl. ..................... 438/457; 438/406; 438/455; 438/459; 148/DIG. 12
[58] Field of Search .................................. 438/455, 457, 438/459, 406; 148/DIG. 12

[56] References Cited

U.S. PATENT DOCUMENTS

| 4,985,745 | 1/1991 | Kitahara et al. ......................... 437/62 |
| 5,071,785 | 12/1991 | Nakazato et al. ......................... 437/62 |
| 5,113,236 | 5/1992 | Arnold et al. ............................ 257/347 |
| 5,183,783 | 2/1993 | Ohta et al. .............................. 437/974 |

FOREIGN PATENT DOCUMENTS

| A 0 444 943 | 9/1991 | European Pat. Off. . |
| A 0 464 837 | 1/1992 | European Pat. Off. . |
| A 0 469 583 | 2/1992 | European Pat. Off. . |
| A 57-170 539 | 10/1982 | Japan . |
| 0215041 | 8/1989 | Japan .................... 148/DIG. 135 |
| 0302740 | 12/1989 | Japan .................... 148/DIG. 12 |
| 0298047 | 12/1990 | Japan .......................... 437/62 |
| 0094416 | 4/1991 | Japan .................... 148/DIG. 12 |

OTHER PUBLICATIONS

English translation of JP 01-302740; pp. 1–14, Dec. 6, 1989.
Wolf; "Silicon Processing for the VLSI Era"; 1986; pp. 532–534.
Patent Abstract of Japan, vol. 13, No. 38 (E-709) Japanese Application No. 63-237408, (Sumitomo Metal Mining Co., Ltd.) Jan. 27, 1989.
IEEE Transactions on Electron Devices, vol. 38, No. 7, Jul. 1991, New York U.S. pp. 1650–1654, A. Nakagawa et al., "Breakdown Voltage Enhancement for Devices on thin Silicon Layer/Silicon Dioxide Film".

*Primary Examiner*—Trung Dang
*Attorney, Agent, or Firm*—Jaeckle Fleischmann & Mugel, LLP

[57] ABSTRACT

Warpage in a bonded wafer is limited by maintenance of a stress compensation layer on the backside of the bonded wafer during device fabrication processing. One embodiment applies a sacrificial polysilicon layer over a stress compensation silicon dioxide layer for bonded silicon wafers. The fabrication processing consumes the polysilicon layer but not the stress compensation silicon dioxide.

4 Claims, 9 Drawing Sheets

OXIDIZE WAFER

BOND DEVICE WAFER TO HANDLE WAFER

THIN DEVICE WAFER

TRENCH MASK OXIDE

TRENCH PR AND ETCH

SIDE + TOP OXIDE TRENCH FILL (POLY) AND PLANARIZATION

AFTER MASK
OXIDE ETCH

AFTER RIE
SILICON TRENCH
ETCH

AFTER LATERAL
ISOLATION OXIDE
FORMATION

AFTER RIE
BOTTOM OXIDE
ETCH

AFTER POLY TRENCH
FILL AND
PLANARIZATION

BONDED WAFER PROCESSING

This application is a continuation of application Ser. No. 08/653,808 filed May 28, 1996 now abandoned, which is a continuation of Ser. No. 08/335,600, filed on Nov. 8, 1994 now abandoned, which is a file wrapper continuation of Ser. No. 07/900,202, filed Jun. 17, 1992 now abandoned.

BACKGROUND AND SUMMARY OF THE INVENTIONS

The present invention relates to electronic integrated circuits and methods of fabrication, and, more particularly, to dielectrically isolated semiconductor integrated circuits and related fabrication methods.

Silicon-on-insulator substrates

Integrated circuits fabricated in silicon-on-insulator substrates offer performance advantages including freedom from latchup for CMOS structures, high packing density, low parasitic capacitance, low power consumption, radiation hardness, high voltage operation, and the possibility of three dimensional integration. Indeed, isolation trenches extending through the silicon layer down to the insulation provide a simple approach to dielectric isolation of integrated circuit devices. The sidewalls of such trenches are coated with an insulator, usually silicon dioxide ("oxide"), and the remaining portion of trench opening, if any, is filled with a filler which is usually polycrystalline silicon. Diffused PN junctions can also be used for lateral isolation.

Additionally, silicon-on-insulator technology using very thin films offers special advantages for submicron devices. Scaling bulk devices tends to degrade their characteristics because of small-geometry effects, such as punch-through, threshold voltage shift, and subthreshold-slope degradation. The use of silicon-on-insulator devices suppresses these small-geometry effects. Therefore, even in the submicron VLSI era, silicon-on-insulator technology can offer even higher device performance than can bulk technology, along with the inherent advantages of silicon-on-insulator.

Silicon-on-insulator substrates may be fabricated in various ways: a crystalline silicon layer may be formed over an existing oxide layer either by laser or strip heater recrystallization of polysilicon deposited on the oxide or by selective epitaxial silicon growth over the oxide. However, the quality of such a silicon layer is generally inferior to that normally associated with bulk silicon. Other approaches form an oxide layer beneath an existing high quality silicon layer either by oxidizing a buried porous silicon layer or by oxygen ion implantation; however, such oxide is low quality and the silicon top layer may be damaged during the oxide layer formation.

Another approach to silicon-on-insulator is wafer bonding as described by J. Lasky et al., Silicon-On-Insulator (SOI) by Bonding and Etch-Back, 1985 IEDM Tech. Deg. 684. This wafer bonding process proceeds as follows: a lightly doped epitaxial layer of silicon is grown on a heavily doped silicon substrate, oxide is thermally grown on the epilayer, a second lightly doped silicon substrate is thermally oxidized, the two oxidized surfaces are pressed together. See FIG. 1a. The pressed together wafers are inserted into an oxidizing atmosphere at 1,100° C. to bond them as illustrated in FIG. 1b. Lastly, a preferential etch is used to remove the heavily doped substrate, leaving the thin, lightly doped epitaxially layer above the bonded thermally grown oxides which are now on the second substrate as shown in FIG. 1c. The resulting thin silicon layer above the thermally grown oxide has high quality and the oxide also retains its quality and may be thick, as might be desired for CMOS or high voltage devices, or then, as might be desired for shared element applications. FIG. 1d heuristically illustrates trench isolation with poly filled trenches isolating MOSFET and bipolar devices.

Conceptually, this process may meet all the desired goals for the ultimate silicon-on-insulator material (a specular finished crystalline silicon layer without dislocations and a back interface with the insulator of quality equal to the interface of thermally grown silicon dioxide on silicon; both the crystalline silicon layer and the insulator of variable thickness).

Another wafer bonding method, illustrated in FIGS. 2a–c and described in copending U.S. patent application Ser. No. 07/834,439, filed Feb. 12, 1992, now U.S. Pat. No. 5,266,135, proceeds as follows. Start with a device wafer having a lightly doped epilayer on a heavily doped substrate and a handle wafer with a thick (4,000 Å) oxide layer. Activate the surface of the device wafer with an acid or peroxide wash to enhance hydroxyl group formation. Place a drop of oxidant such as water plus hydrogen peroxide on the oxide, and squeeze the wafers together. See FIG. 2a. The drop of oxidant has a volume in the range of 0.8 to 8.0 microliters per square inch of wafer surface. Dry the squeezed wafers at room temperature for a day and then heat the squeezed wafers to 1150 degrees C. for two hours. The heating drives an oxidation of the device wafer and the silicon-oxygen bonds formed fuse the two wafers. See FIG. 2b. Lastly, grind and etch back the device wafer until exposure of the device epilayer. This completes the silicon-on-insulator substrate as shown in FIG. 2c.

However, bonded wafers have problems including warpage. In particular, the oxide (or other dielectric) used to bond the two wafers together is usually formed in a stressed condition. For example, when the wafers are silicon and the oxide is formed by thermal oxidation, the oxide is in compressive stress and causes the bonded wafer to warp. Indeed, the device epilayer may be quite thin (1 μm) and the handle wafer of typical wafer thickness (500 μm), so the epilayer-oxide stress can be accommodated by elastic deformation of the epilayer, but the handle-oxide stress will produce warpage. The greater the stress, the greater the warpage. The bonding process produces a compressive oxide on the device wafer as in thermal oxidation. However, even for thicker epilayers (e.g., 15–50 μm thick for high voltage applications) the handle-oxide stress dominates and warpage may occur.

The wafers cannot be handled by manufacturing equipment such as aligner chucks when the warpage is too large. This causes manufacturing yield loss and limits the maximum bond oxide thickness which can be used. Thus there is a need to reduce the warpage induced by stress in bonded wafer dielectric films.

Features

The present invention provides bonded wafer processing with a stress compensation layer to deter warpage and during processing the stress compensation layer is protected. Other embodiments deter warpage by reduction of stress in the bonding layer within the bonded wafer.

BRIEF DESCRIPTION OF THE DRAWINGS

The present invention will be described with reference to the accompanying drawings, which are schematic for clarity.

DESCRIPTION OF THE PREFERRED EMBODIMENTS

First Warpage Control Method

Figure 1:
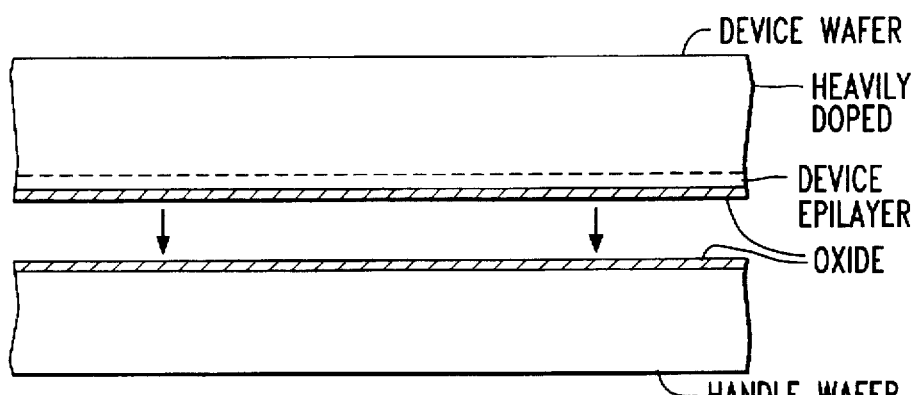
FIGS. 1a–d and 2a–c illustrate in cross sectional elevation views known wafer bonding methods and integrated circuits.
Figure 1B:
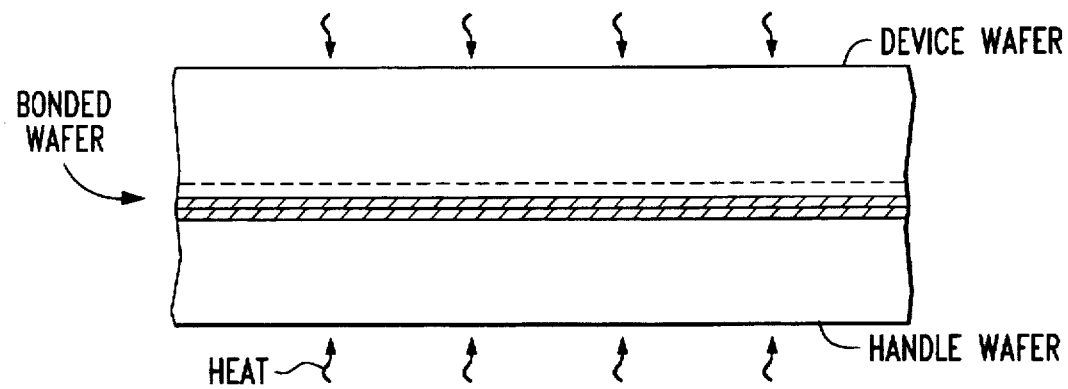
Figure 1C:
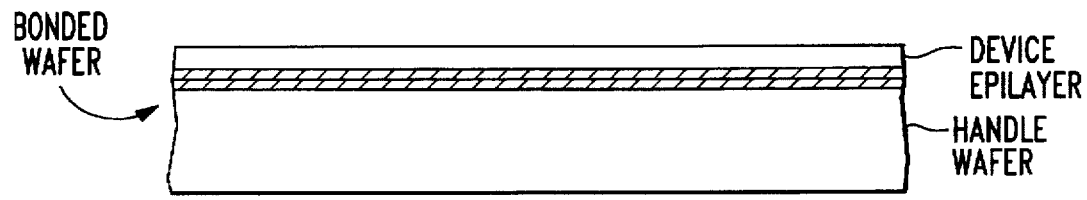
Figure 1D:
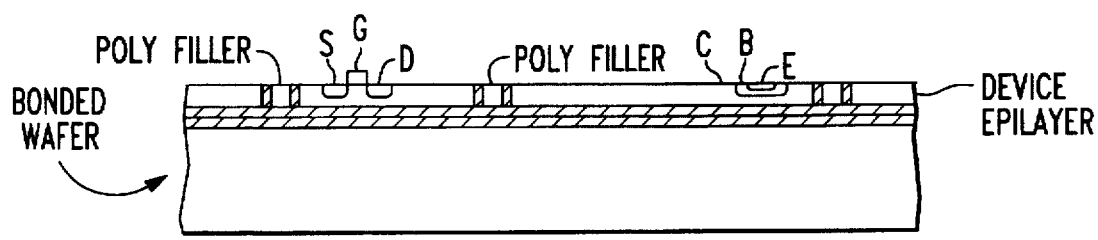
Figure 2A:
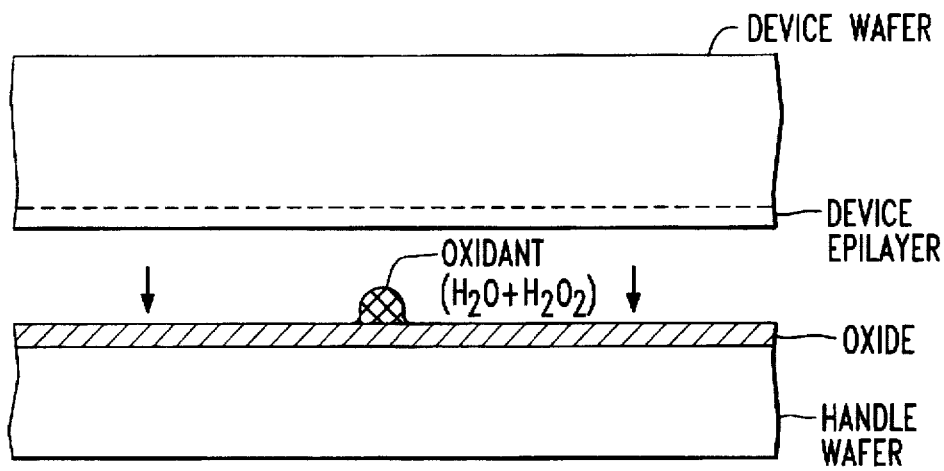
Figure 2B:
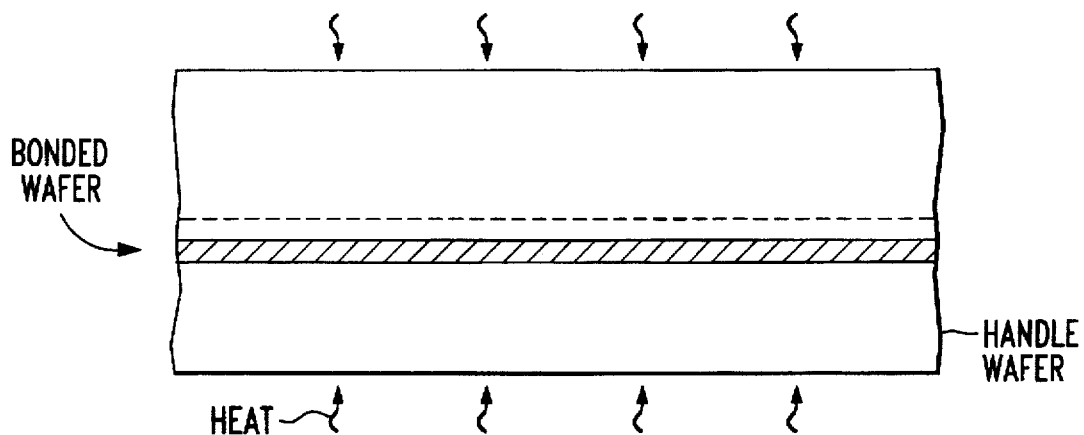
Figure 2C:
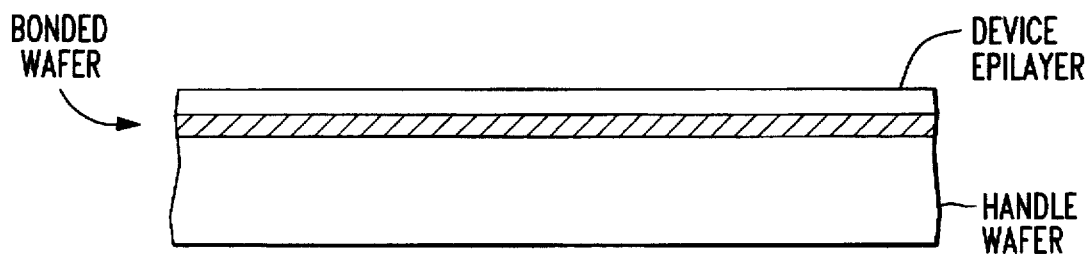
Figure 3A:
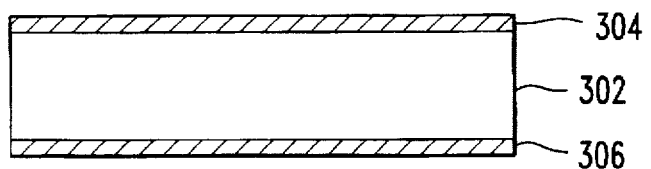
FIGS. 3a–f are cross sectional elevation views of a first preferred embodiment method of warpage control in bonded wafer processing.
Figure 3B:
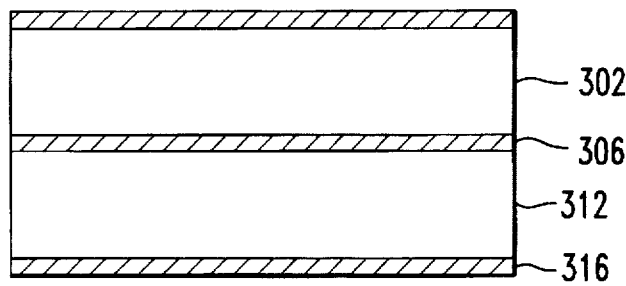
Figure 3C:
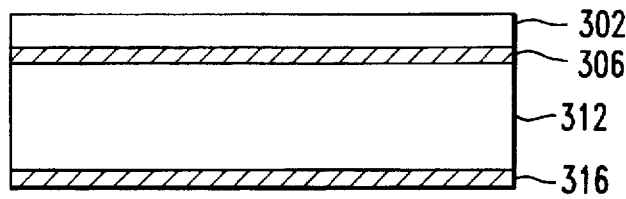
Figure 3D:
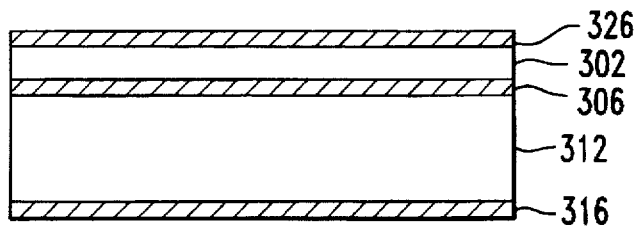
Figure 3E:
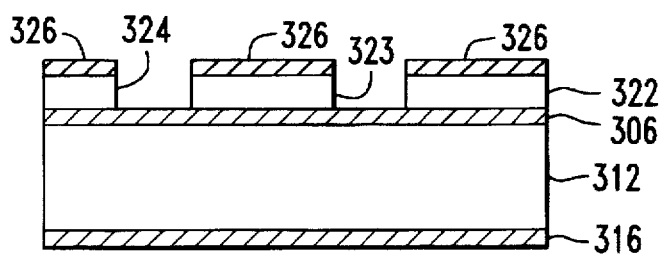

FIGS. 3a–e illustrate in cross sectional elevation view a first preferred embodiment method of warpage control in bonded wafer processing. The bonded wafer processing proceeds as follow:

(a) Begin with a 4-inch diameter silicon wafer 302 of doping type and resistivity (e.g., N type and 20 ohm-cm resistivity) desired for eventual device fabrication and with standard wafer thickness of about 500 μm as illustrated in FIG. 3a. Thermally oxidize wafer 302 to form oxide layers 304 and 306. Oxide 306 will become the bottom oxide, so the oxide is grown to the desired bottom oxide thickness; for example, 4 μm. If a buried layer in the final device sturctures is desired, then prior to the thermal oxidation of wafer 302, the eventual buried layer would be formed by doping wafer 302 on the face to be oxidized to bottom oxide 306.

(b) Press handle wafer 312 and device wafer 302 together with a drop of oxidizer on the surface of oxide 306 to bond in a furnace cycle with oxidizing ambient which will grow about 2 μm of backside oxide 316 on handle wafer 312. See FIG. 3b.

(c) After bonding, remove the bulk of device wafer 302 by grinding, lapping, and polishing to leave the desired device island thickness; for example, 35–40 μm. This thinning of device wafer 302 proceeds without any etchstop, so the final thickness of device wafer 302 depends upon process control. See FIG. 3c.

(d) Thermally grow mask oxide 326 on device wafer 302 to a thickness of about 4 μm, this increases backside oxide 316 on handle wafer 312 to about 4.5 μm. Mask oxide 326 will be used as a trench etch mask. See FIG. 3d.

(e) Print a trench pattern into photoresist spun onto mask oxide 326. Note that the bottom oxide 306 (4 μm), the mask oxide 326 (4 μm) and the backside oxide 316 (4.5 μm) are all fairly closely matched in thickness during the photoresist patterning. Use the patterned photoresist as etch mask to wet etch (HF) the trench pattern in oxide 326. The wet etch removes 4 μm from backside oxide 316 to leave only 0.5 μm. Then strip the photoresist and use the patterned oxide 326 to plasma reactive ion etch (RIE) device wafer 302 to form silicon islands 322, 323, . . . on bottom oxide 306. See FIG. 3e.

Figure 3F:
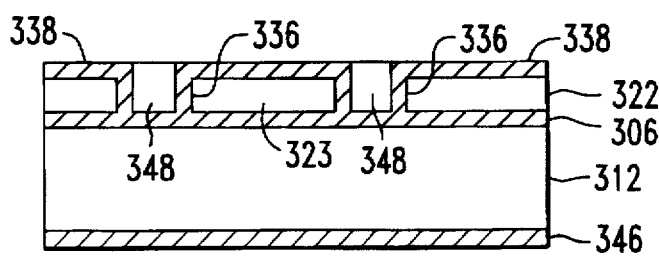

(f) Strip patterned oxide 326 with a wet etch. This etch also removes the remaining backside oxide 316 on the back of handle wafer 312. Then thermally grow oxide to a thickness of 4 μm to form isolation oxide 336 on the sides of islands 322, 323, . . . This also forms 4 μm of oxide 338 on the island surfaces and 4 μm of oxide 346 on handle wafer 312. This also thickens the portions of bottom oxide 306 exposed at the trench bottoms. Next, deposit polysilicon 348 to fill the trenches. Lastly, planarize to remove the polysilicon except from the trenches. See FIG. 3f. Note that again the island surface oxide 338, bottom oxide 306, and backside oxide 346 all have the same thickness (4 μm).

(g) Fabricate devices in islands 322, 323, . . . with repeated cylces of (1) thermally grow oxide layer, (2) spin on photoresist using a spinner vacuum chuck, (3) pattern the photoresist using an aligner vacuum chuck, (4) wet etch the oxide using the patterned photoresist as etch mask, (5) and diffuse or implant or etch silicon using the patterned oxide as diffusion/implant/etch mask. The patterned oxides may remain from cycle to cycle. Wet etches provide better throughput if line width is not a problem, and thus high voltage processes often use wet etches. However, wet etches attack backside oxide 346, and the thermal growth of oxide does not restore backside oxide 346 as quickly as it is removed due to the parabolic growth rate of thermal oxide. That is, when step (1) grows an oxide of thickness T μm, backside oxide 346 increases in thickness less than T μm; but the wet etch to etch the grown oxide of will remove at least T μm from backside oxide 346. Thus backside oxide 346 would suffer net removal while bottom oxide 306 would not be affected. This would lead to an increasing thickness differential and warpage and processing failure. However, coating the backside with a sacrificial layer which is partially or completely consumed during subsequent manufacturing steps can protect the stress compensation backside oxide 346. A polycrystaline or amorphous silicon film can be used as a sacrificial layer. The sacrificial silicon layer has a thickness greater than the thickness of silicon removed by further, subsequent processing steps. Its thickness should be chosen such that the oxidations and etches to which the back of the wafer is subjected do not remove the entire protective layer until the underlying oxide alone can maintain sufficient stress compensation through the remainder of the warpage sensitive part of the manufacturing process. It may be desirable to adjust the thickness of backside oxide 346 so that the net stress of oxide and polysilicon matches that of bottom oxide 306.

An example of the method is a bonded wafer dielectric isolation (DI) process for high voltage IC's. The bottom oxide is 4 μm thick grown by conventional furnace thermal oxidation. The islands are isolated by polysilicon filled lateral trench isolation with oxide separating the poly trench fill from the islands. The stress compensation layer is at least about 4 μm thermal grown oxide. The protective layer is a 2–3 μm layer of polysilicon. The thickness of polysilicon is chosen such that the sequence of thermal oxidations and subsequent wet (buffered HF) oxide etches performed during wafer processing does not remove the entire polysilicon protective layer. Typically, the processing will include five or six repeated cycles of wet etch openings in frontside oxide with a patterned photoresist mask, introduce of dopants through the oxide openings, and thermally drive-in the dopants while growing oxide. Such cycles will also grow oxide from the polysilicon during the drive-ins and remove this oxide during the wet etches. Consequently, the polysilicon removal rate can be easily computed.

Figure 4A:
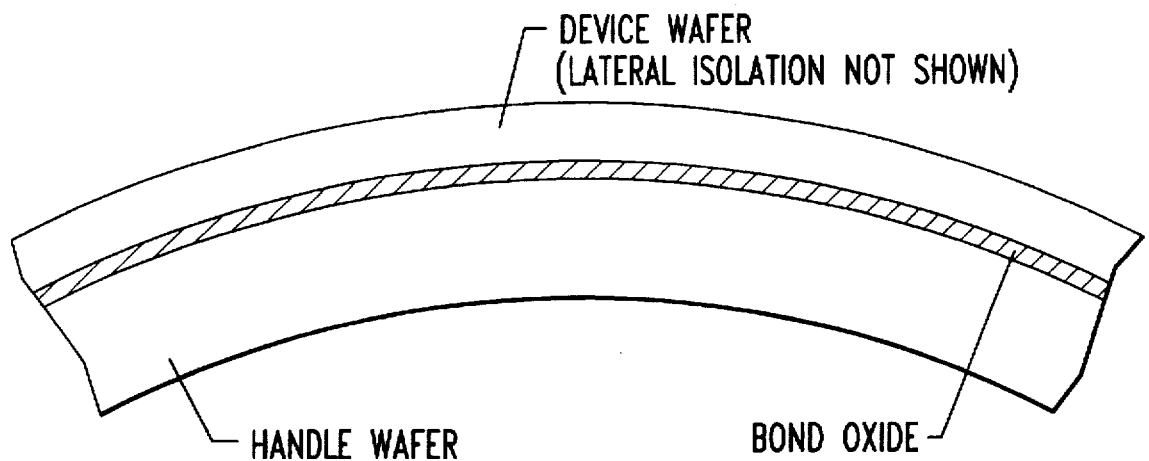
FIGS. 4a–c further illustrate the first preferred embodiment method.
Figure 4B:
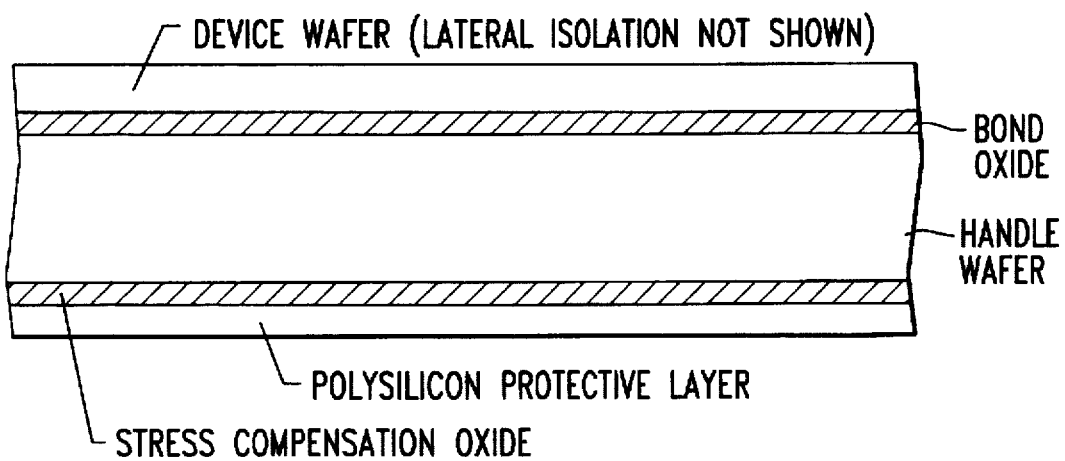

Wafers with and without the stress compensation plus protection layers are schematically illustrated in FIGS. 4a and 4b, respectively.

Figure 4C:
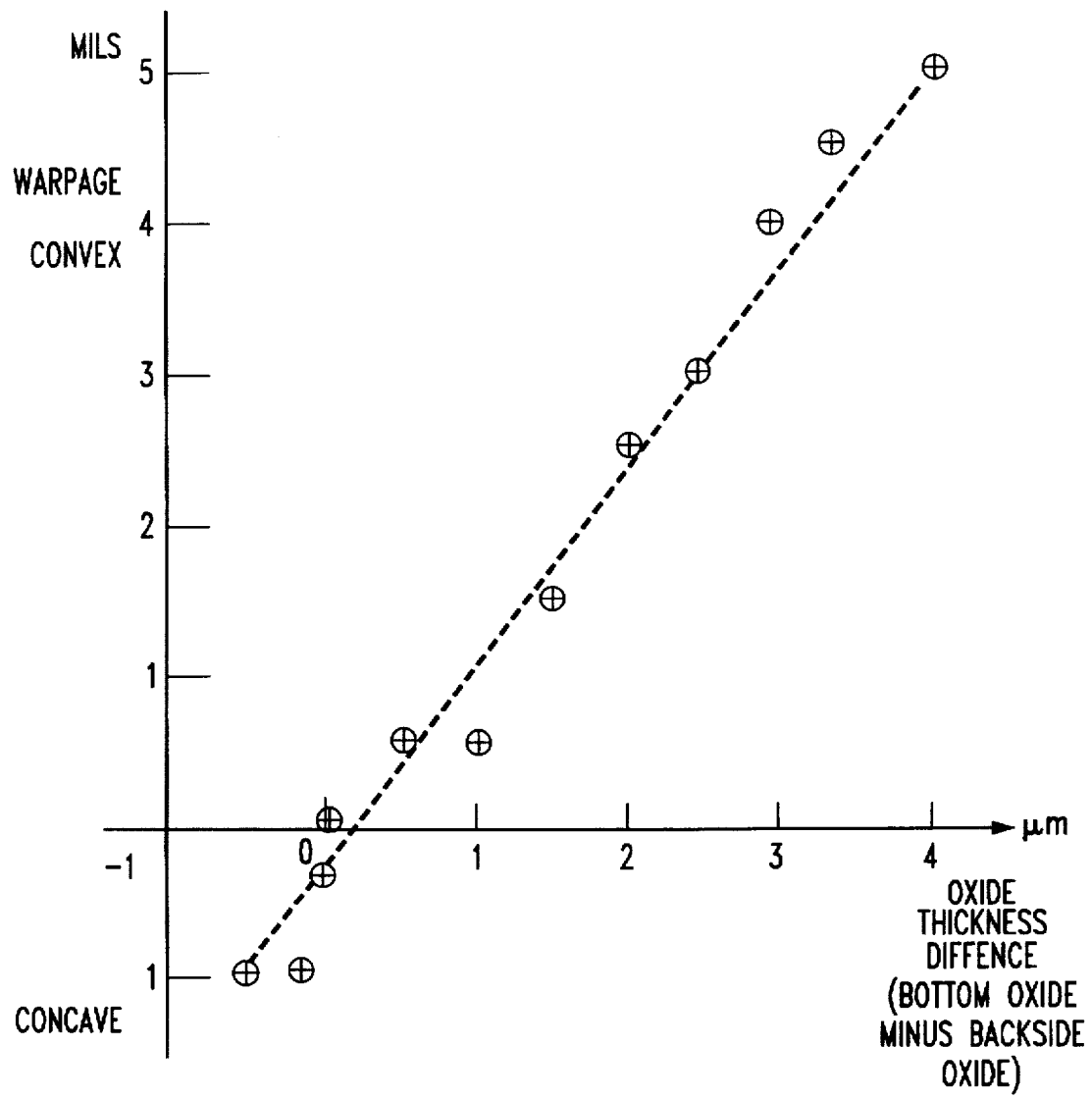

Experimentally, when the thickness difference between bottom oxide 306 and the stress compensation backside oxide 346 is less than about 2 μm for 4 inch starting wafers of thickness about 500 μm, then the warpage can be tolerated by most vacuum chucks used. This implies that backside oxide 346 need not be protected at every possible occurence of an oxide etch as long as protection is used to insure that the magnitude of the thickness difference remains less than about 2 μm. Indeed, FIG. 4c graphically illustrates the warpage (in mils) of a 4-inch bonded wafer with a device layer thickness of about 20 μm and a bottom oxide thickness of 4 μm as a function of the thickness difference. Note that FIG. 4c includes both positive and negative thickness differences which correspond to the bottom oxide being thicker and thinner than the backside oxide, respectively. For the positive thickness differences the bonded wafer had convex warpage as in FIG. 4a.

With more sensitive vacuum chucks than used so far, the maximum difference would need to be smaller.

Second Warpage Control Method

Protection of the stress compensation backside oxide 346 of the first method can also be achieved by coating the oxide with a layer of material such as silicon nitride which is not removed by processes to which the back side is exposed until all warpage sensitive process steps have been completed. In this case, the oxide 346 thickness may be adjusted so that the combined stress of the oxide and its permanent protective layer (such as nitride) match the stress of the bottom oxide 306. For example, 3000 A of nitride on 3 μm of oxide could be used in place of backside oxide 346. Further, the backside oxide 346 could be completely replaced by nitride, although this would require the oxide and nitride formations be controllable to produce at least approximately matching stressed layers. The thicknesses of the bottom oxide and a backside nitride could be almost invariant throughout the processing.

Third Warpage Control Method

Another way to protect stress compensation oxide layer 346 of the first method is to coat backside oxide 346 with photoresist prior to a wet etch and remove it after the wet etch. This can protect backside oxide 346 and keep its thickness comparable to that of bottom oxide 306 to prevent warpage. Once devices and interconnections have been formed in islands 322,323, . . . and other warpage sensitive steps completed, then backside oxide 346 can be removed.

Fourth Warpage Control Method

Figure 5A:
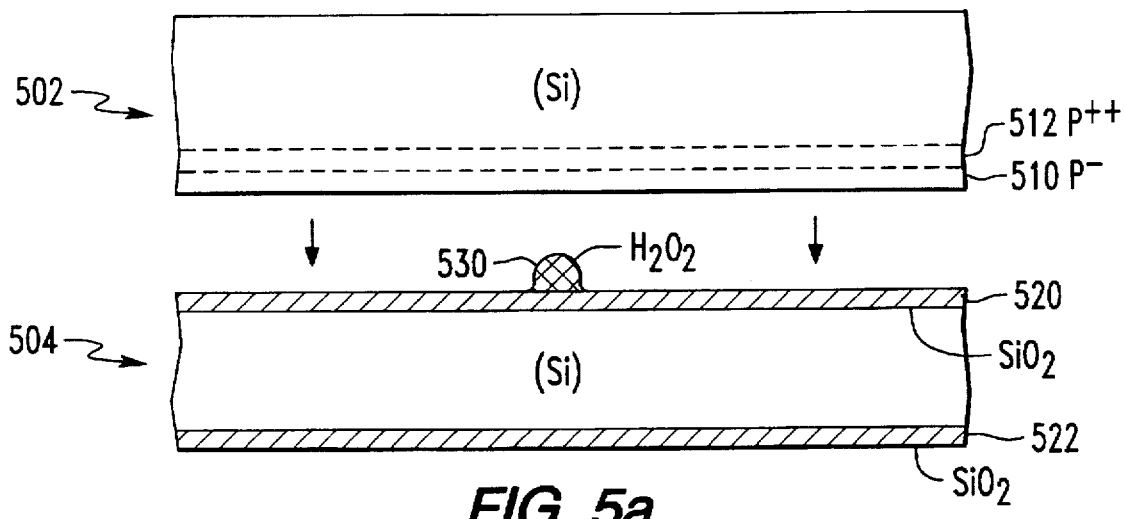
FIGS. 5a–i are cross sectional elevation views of a fourth preferred embodiment.
Figure 5B:
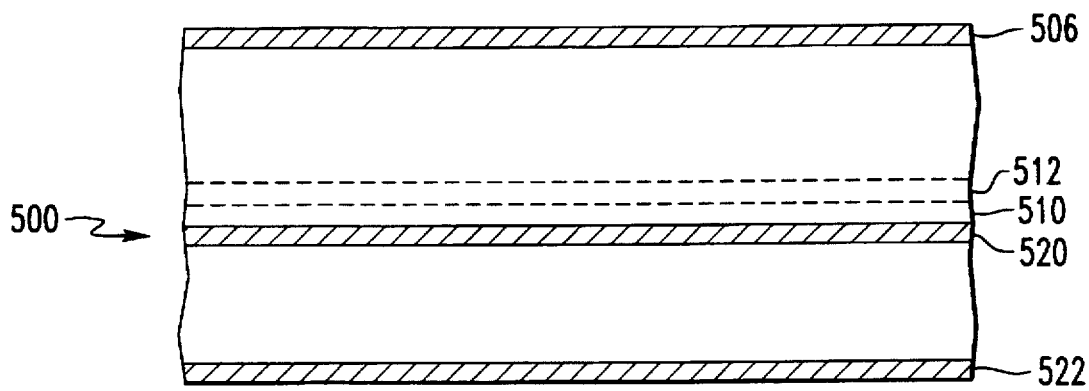

FIGS. 5a–i show in cross sectional elevation view a fourth preferred embodiment method of warpage control in bonded wafer processing. The bonded wafer processing proceeds as follow:

(a) Begin with two 4-inch diameter silicon wafers of thickness about 500 μm as illustrated in FIG. 5a. Wafer 502 is the device wafer and wafer 504 is the handle wafer. Device wafer 502 has lightly doped device epilayer 510 of thickness about 35 μm and heavily doped etchstop layer 512. Device epilayer 510 has only a native oxide on its surface. Handle wafer 504 has 4 μm thick oxides 520 and 522 on its surfaces; oxide 520 will become the bottom oxide in the final bonded wafer, and oxide 522 will just be a backside oxide. For high voltage products the bottom oxide must be several μm thick. These oxides may be formed simultaneously such as by thermal oxidation in steam. Oxides 520 and 522 have the same compression/tension and thus provide balanced stresses on handle wafer 504 and will deter warpage of the bonded wafer. Indeed, the purpose of backside oxide 522 is warpage deterrence by providing a stress approximately balancing that of bottom oxide 520. FIG. 5a also shows a drop 530 of water plus hydrogen peroxide which are silicon oxidizers.

(b) Press wafers 502 and 504 together. Drop 530 wets the surface of bottom oxide 520 and migrates throughout the contact interface of pressed-together wafers 502–504. The theoretical average thickness of such liquid layer is about 6 μm for a drop of volume 0.05 milliliters (about 4 microliters/ square inch). After drying for a day, the pressed-together wafers are heated to about 1150 degrees C. for two hours which drives the oxidation of the surface region of device epilayer 510. This oxidation forms silicon-oxygen bonds which effectively extend bottom oxide 520 to device epilayer 510 and thereby fuse wafers 502–504 to form bonded wafer 500. The heating may be performed in an oxidizing ambient and thus grow oxide 506 and thicken oxide 522. However, bottom oxide 520 thickens based on the amount of oxidizer in drop 530 and typically ends up being about 4 μm thick. Ideally, the thicknesses of bottom oxide 520 and backside oxide 522 remain roughly equal. See FIG. 5b. Also, the growth of bottom oxide 520 consumes a portion of device epilayer 510. Typically, device epilayer 510 has a final thickness of about 35 μm.

Figure 5C:
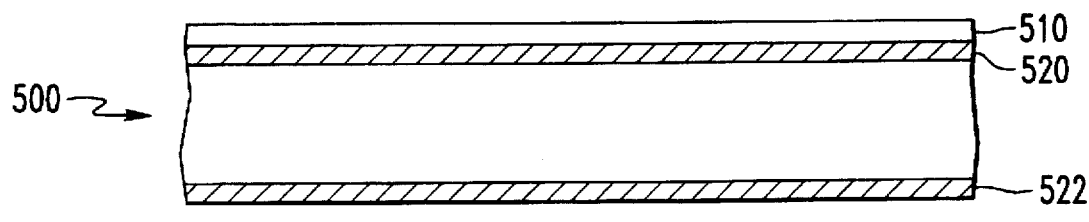

(c) Remove oxide 506 and the bulk of former device wafer 502 by grinding and then etching down to etchstop 512 with KOH and propanol. Then remove etchstop 512 with HF, HNO$_3$, and acetic acid which preferentially etches the heavily doped etchstop layer 512 and stops on lightly doped device epilayer 510. This leaves bonded wafer 500 as illustrated in FIG. 5c.

Figure 5D:
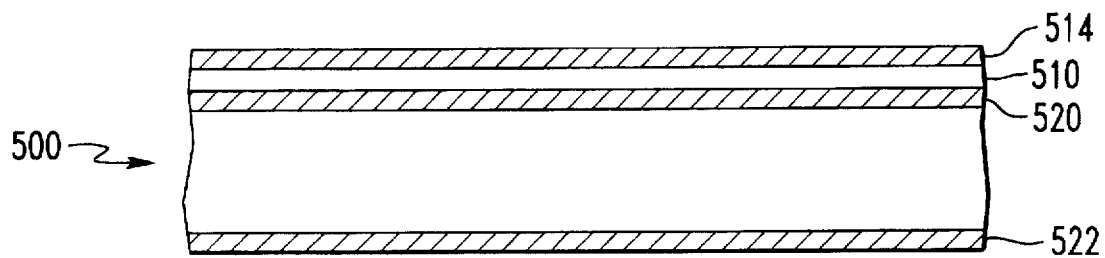

(d) Form isolation trenches in device epilayer 510 by plasma etching with an oxide etch mask. This proceeds by first forming an oxide coating on device epilayer 510, patterning photoresist on the oxide coating, etching the oxide using the patterned photoresist as etch mask, and then etching device epilayer 510 using the etched oxide as etch mask. Thus, first thermally oxidize device epilayer 510 to form oxide 514 of thickness 4 μm. This oxidation also increases the thickness of oxide 522 to about 4.5 μm, although the growth is parabolic and not nearly so fast as that of oxide 514 due to the existing thickness of oxide 522. FIG. 5d shows bonded wafer 500 after this oxidation.

Figure 5E:
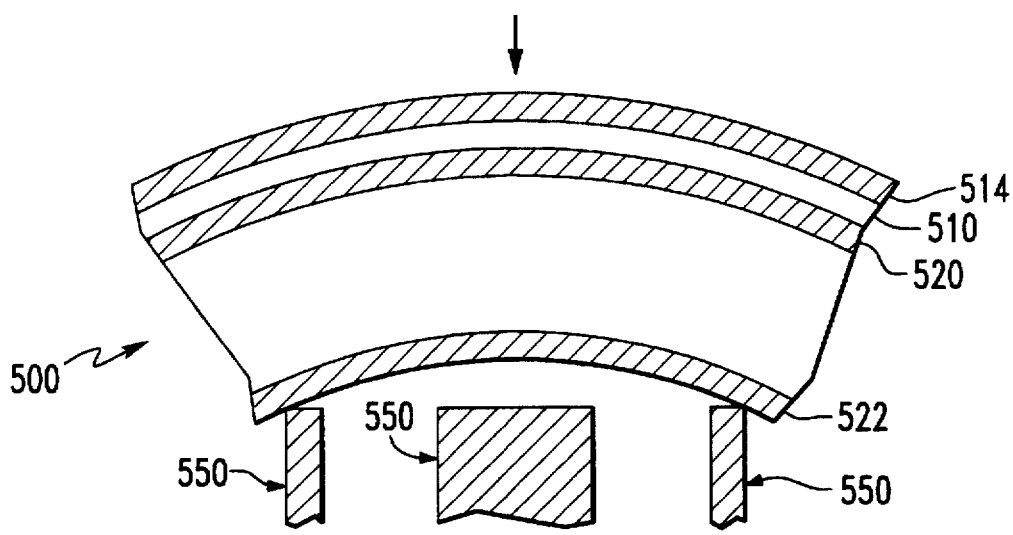
Figure 5F:
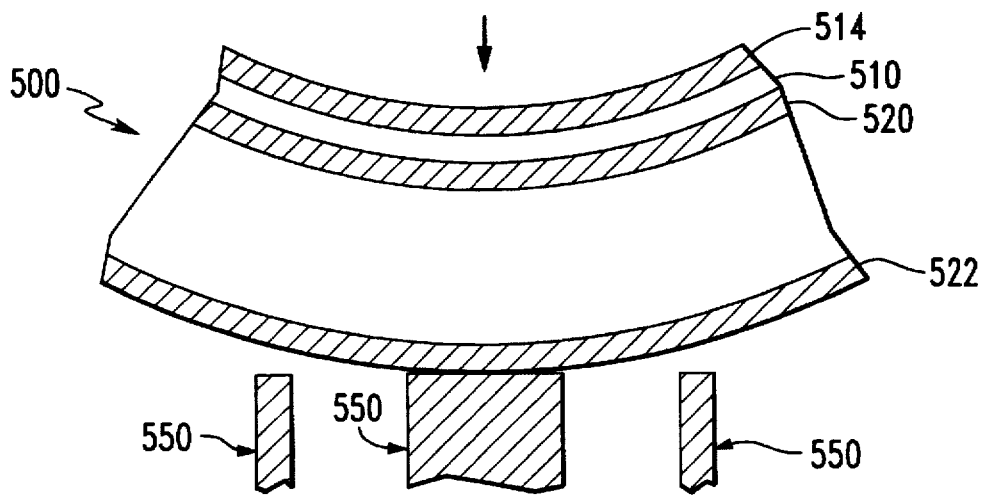
Figure 5G:
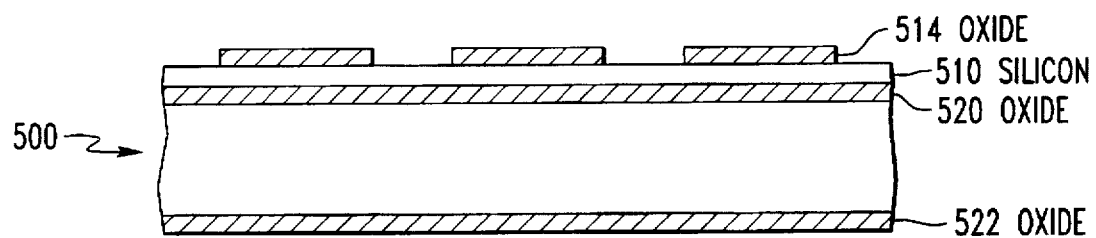
Figure 5H:
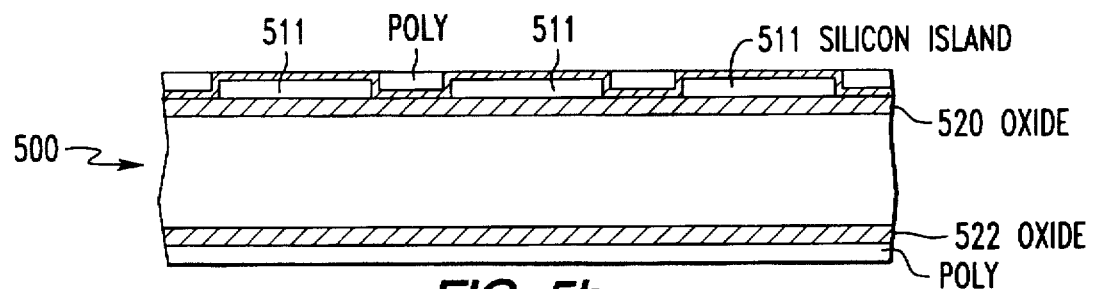
Figure 5I:
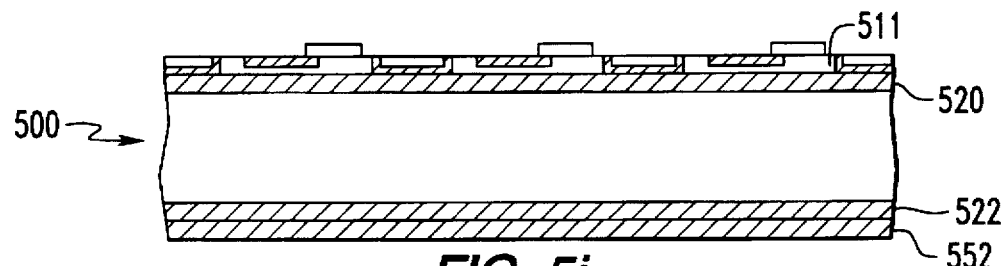

(e–f) Place bonded wafer 500 on a vacuum chuck and spin on photoresist and harden the photoresist. Then place the photoresist-covered wafer on an aligner vacuum chuck in a projection aligner and expose the photoresist to the trench isolation pattern. If bonded wafer 500 were warped on the magnitude of 5 mils deviation from flat at the center, then a vacuum chuck may be unable to hold the wafer down and the photoresist application or patterning may be impossible to perform. However, for bonded wafer 500 the thickness of bottom oxide 520 differs from the thickness of backside oxide 522 by only about 0.5 μm, and this keeps the warpage of bonded wafer 500 within tolerable limits. Oxides 520 and 522 are both compressive and under similar stress, then bottom oxide 520 being thicker than backside oxide 522 implies a warpage as shown (exaggerated) in FIG. 5e. FIG. 5e also heuristically indicates vacuum chuck 550 and the direction of vacuum pull. Conversely, if bottom oxide 520 were thinner than backside oxide 522, then the warpage would be as shown in FIG. 5f. Because a vacuum chuck pulls at the center of a wafer, warpage as in FIG. 5e can be more easily tolerated than that shown in FIG. 5f.

(g) After photoresist exposure, develop the photoresist and bake. Then use the patterned photoresist to wet etch oxide layer 514. This wet etch also attacks backside oxide 522 and thins it. An overetch of oxide 514 (thickness 4 μm) removes at least 4 μm of backside oxide 522. However, this removal of backside oxide 522 is prevented by spinning photoresist onto backside oxide 522 just prior to the wet etch. This extra photoresist protects the backside oxide during the wet etch. After the wet etch, remove the backside photoresist along with the patterned photoresist on oxide 514. See FIG. 5g.

(h) Plasma etch trenches in device epilayer 510 using patterned oxide 514 as the etch mask. The trenches extend down into bottom oxide 520 and leave device epilayer 510 in the form of islands 511 of silicon on bottom oxide 520. Next, form oxide on the sidewalls of the trenches by thermal oxide growth to a thickness of about 4 μm; this a lateral isolation oxide formation. The oxidation also increases the thickness of the oxide 514 already on the tops of islands 511 plus thickens backside oxide 522. Then fill the trenches by deposition of polysilicon. Either LPCVD or epitaxial deposition; LPCVD covers both front and back of bonded wafer 500. Then planarize with a chemical and mechanical polish back which stops on oxide. See FIG. 5h.

(i) Fabricate devices in islands 511 with repeated cylces of (1) thermally grow oxide layer, (2) spin on photoresist using spinner vacuum chuck, (3) pattern the photoresist using an aligner vacuum chuck, (4) wet etch the oxide using the patterned photoresist as etch mask, (5) and diffuse or implant or etch silicon using the patterned oxide as diffusion/implant/etch mask. The patterned oxides may remain from cycle to cycle. As previously noted, wet etches attack backside oxide 522, and the thermal growth of oxide does not restore backside oxide 522 as quickly as it is removed due to the parabolic growth rate of thermal oxide. Thus backside oxide 522 would suffer net removal while bottom oxide 520 would not be affected; and this would lead to a thickness differential and warpage and processing failure. However, coating backside oxide 522 with photoresist 552 prior to a wet etch and removal after the wet etch can protect backside oxide 522 and keep its thickness comparable to that of bottom oxide 520 to prevent warpage. See FIG. 5i. Once devices and interconnections have been formed in islands 511 and other warpage sensitive steps completed, then the backside oxide 522 can be removed.

Differential Stresses

It may be desirable to have the stresses of the bottom oxide and the backside oxide not quite equal so that the net residual stress causes a small warpage which is always in the same direction. As an example, one might want the center of the bottom to be above the circumference so that the perimeter of the wafer back makes first contact with wafer chucks thereby providing good sealing action when vacuum is applied. FIG. 5e illustrates this situation.

Unprotected Stress Compensation Layer

In some cases, the stress compensation layer can be used without protection. This occurs when the thickness removed in subsequent process steps is small enough that the remaining part of the stress compensation layer keeps warpage within acceptable limits during all warpage sensitive processing steps. Thus in any of the methods the protection could be foregone in all steps following some cutoff step.

Bottom Oxide Breakup

Warpage in bonded wafers may also be reduced by breaking up the sheet of bottom oxide which extends across the entire surface of the handle wafer. When broken up in small areas, the stress is reduced because there is less stressed oxide present and the oxide that is present may relax by expanding into the edges of non-oxide areas.

Figure 6:
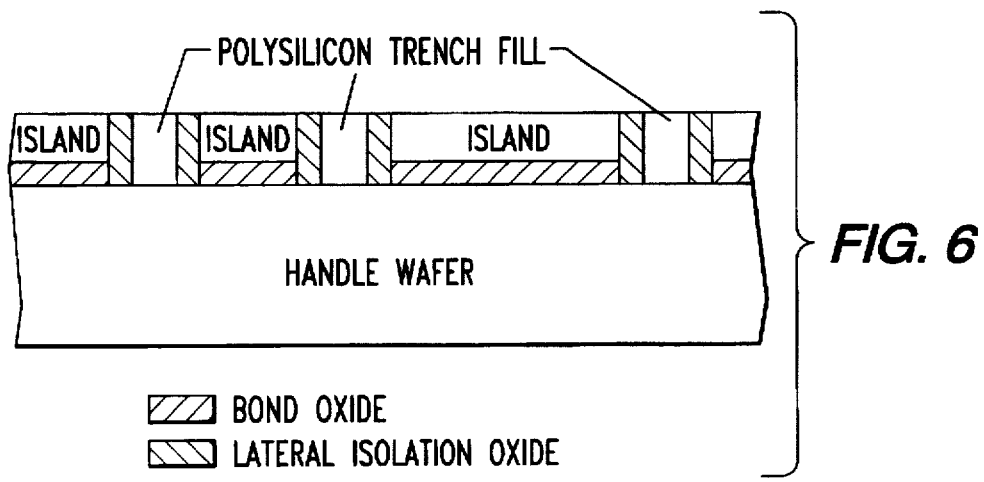
FIGS. 6 and 7a–e illustrate another preferred embodiment method.
Figure 7A:
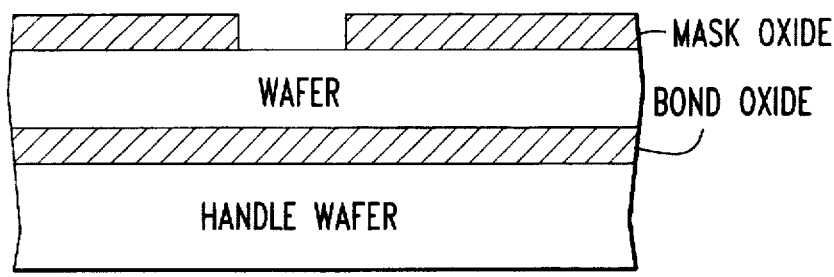
Figure 7B:
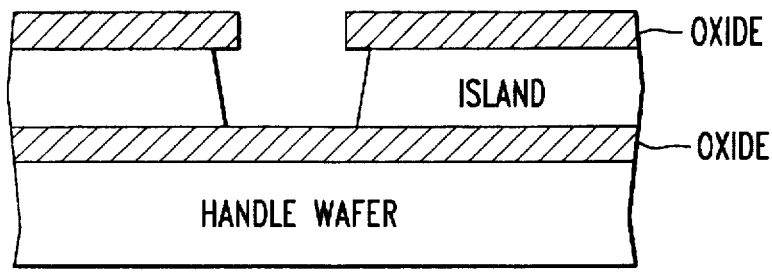
Figure 7C:
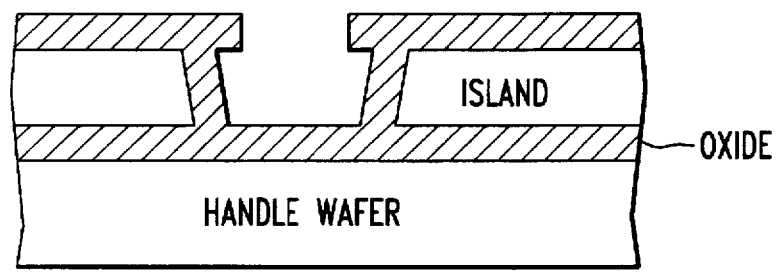
Figure 7D:
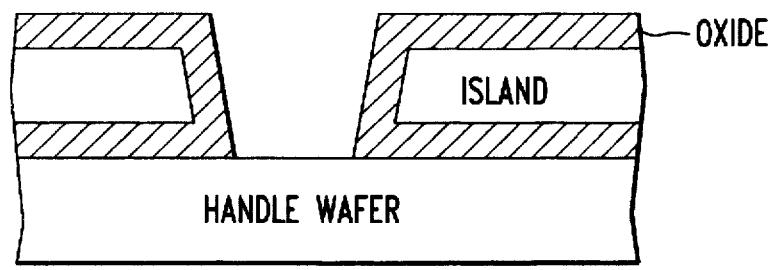
Figure 7E:
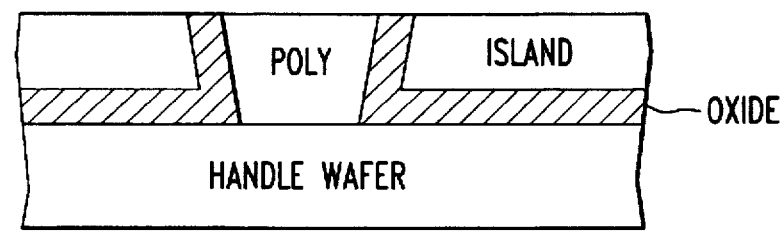

The bottom oxide can be broken up be removing it from the bottoms of the areas taken up by lateral trench isolation as shown in FIG. 6. Alternatively, or as an additional area of bottom oxide removal, the bottom oxide can be removed from the areas surrounding each circuit which are provided as areas to be cut (scribed or sawed) to separate the circuits from one another when wafer processing is complete.

The bottom oxide can be patterned using the following process sequence. Oxide is formed on the wafer to be laterally isolated after it has been thinned and otherwise processed into final form. The oxide is patterned and used as a silicon trench etch mask. The silicon is etched preferably by reactive ion etching to form trenches with nearly vertical side walls. The silicon etch preferably under cuts the oxide so that the oxide mask overhangs the sides of the trenches. Oxide and or other insulator is formed on the sides (and optionally the bottom) of the trenches by thermal oxidation and or conformal oxide deposition by chemical vapor deposition.

Finally the bottom oxide is removed by reactive ion etching with the side oxide being protected by the top oxide overhang (if present) and by the fact that the side walls are nearly vertical and the reactive ion etch process attacks horizontal surfaces only due to the direction of in motion (vertical). This is somewhat similar to forming oxide spacers on the sides of polysilicon gates. The process sequence is illustrated in FIGS. 7a–e. Of course, the mask oxide must be thicker than the bottom oxide to be an effective mask.

Wafer Size

The stress in an oxide (or other material) layer on a silicon (or other material) wafer is proportional to layer thickness, thus a thicker layer will lead to more warpage. Conversely, a thicker wafer will have greater strength against bending and lead to less warpage for the same layer stress. Now, increasing wafer diameters leads to incrasing wafer thicknesses for handling reasons, so 6 inch wafers will likely show less warpage than 4 inch wafers with similar stress layers. Also, the vacuum chucks for 6 inch wafers will exert much greater pull on the wafer than will the chuck for a 4 inch wafer because the pull is proportional to the area of the vacuum chuck. Indeed, the force is proportional to the chuck area times atmospheric pressure assuming that the chuck can reduce pressure under the wafer to a small fraction of atmospheric pressure. This will also make 6 inch wafers likely easier to handle than 4 inch wafers. Note that the uniform stress of a layer on a wafer leads to a constant curvature warpage, so with the same wafer strength and same layer stress, and thus the same warpage curvature, a larger wafer will have a greater center deflection due to its larger size. The deflection will depend approximately quadratically on wafer diameter for small deflections.

Modifications and Variations

The preferred embodiment methods may be varied in many ways while retaining one or more of the features of bonded wafer processing with stress compensation backside layer during processing or with breakup of the bottom oxide for warpage control. For example, the bottom oxide could vary from 2 μm to 6 μm in thickness and accomodate devices operating up to 1000 volts. Similarly, the thickness of the silicon islands could vary from 10 μm to 60 μm for junction breakdown voltages of 100 to 1000 volts, although alternative approaches could provide high breakdown voltages with islands as thin as 1 μm. The orginal bottom oxide could have initially been partially on both the device wafer and the handle wafer if a different bonding process were used. The backside oxide for stress compensation could be formed after the bonding of the two wafers. Other materials could be used, such as bonding gallium arsenide to silicon.

What is claimed is:

1. A method for preparing a plurality of bonded wafers for contact with vacuum wafer chucks comprising the steps of providing a plurality of device wafers and a plurality of handle wafers suitable for bonding to one another;

bonding each device wafer to a first surface of a handle wafer with an oxide layer between said wafers;

providing a stress compensation layer along a second surface of each handle wafer, said stress compensation layer generating a net residual stress for concavely warping the bonded wafer along the second surface of said handle wafer; and placing each bonded wafer on a vacuum wafer chuck such that the concave second surface of the handle wafer makes contact with the wafer chuck.

2. The method of claim 1 further comprising forming a protection layer over stress compensation layer.

3. The method of claim 1 wherein each wafer is further processed for integrated circuit formation by repeated placement on a wafer chuck.

4. The method of claim 3 wherein throughout processing the curvature is concave along the surface of the bonded wafer closest to the stress compensation layer.

* * * * *